United States Patent [19]
Kondo

[11] Patent Number: 5,166,900
[45] Date of Patent: Nov. 24, 1992

[54] NON-VOLATILE SEMICONDUCTOR MEMORY DEVICE WITH IMPROVED LAYOUT

[75] Inventor: Ichirou Kondo, Tokyo, Japan
[73] Assignee: NEC Corporation, Tokyo, Japan
[21] Appl. No.: 602,122
[22] Filed: Oct. 23, 1990
[30] Foreign Application Priority Data Oct. 27, 1989 [JP] Japan .................................. 1-281271

[51] Int. Cl.$^5$ ........................................ G11C 5/02
[52] U.S. Cl. ........................................ 365/63; 365/51
[58] Field of Search ................... 365/63, 51, 207, 208

[56] References Cited
U.S. PATENT DOCUMENTS 4,700,328 10/1987 Burghard .............................. 365/51
4,791,607 12/1988 Igarashi et al. ....................... 365/51

Primary Examiner—Joseph A. Popek
Attorney, Agent, or Firm—Whitham & Marhoefer

[57] ABSTRACT

A non-volatile semiconductor memory device is fabricated on a semiconductor chip and comprises a memory cell array having a plurality of non-volatile memory cells arranged in rows and columns and occupying a first area, a row address decoder unit coupled through word lines to the rows of the non-volatile memory cells and responsive to row address bits for shifting one of the word lines to an active level, a column selector unit coupled through digit lines to the columns of the non-volatile memory cells and occupying a second area contiguous to the first area, a sense amplifier unit coupled through common digit lines to the column selector unit and occupying a third area contiguous to the second area, and a column address decoder unit responsive to column address bits and coupled through output lines to the column selector unit so that the digit lines are selectively coupled to the common digit lines, in which the sense amplifier unit and the column address decoder unit occupy a fourth area contiguous to the third area so that no rearrangement of the output lines is necessary for a new non-volatile semiconductor memory device increased in the number of the memory cells.

9 Claims, 9 Drawing Sheets

NON-VOLATILE SEMICONDUCTOR MEMORY DEVICE WITH IMPROVED LAYOUT

FIELD OF THE INVENTION

This invention relates to a non-volatile semiconductor memory device and, more particularly, to the layout of the component units incorporated in the non-volatile semiconductor memory device.

DESCRIPTION OF THE RELATED ART

FIG. 1 shows the layout of a prior art non-volatile semiconductor memory device fabricated on a semiconductor chip 1. On the semiconductor chip 1, a memory cell array 2 consisting of a plurality of electrically erasable and programmable read only memory cells is located on the right side of a row address decoder unit 3, and word lines W1 to Wn extend from the row address decoder unit 3 through the memory cell array 2. A column selector unit 4 is further disposed in the vicinity of the memory cell array 2, and a sense amplifier unit 5 is spaced from the column selector unit 4. Each electrically erasable and programmable read only memory cell is hereinbelow abbreviated as "EEPROM cell".

As will seen from FIG. 2 of the drawings, every four EEPROM cells M1, M2, M3 and M4 are grouped for a nibble mode of operation, and each of the EEPROM cells M1 to M4 is implemented by a series combination of a switching transistor SWT and a storage transistor STR. The four EEPROM cells are hereinbelow referred to as "EEPROM cell group". The source nodes of the storage transistors STR are commonly coupled to a source voltage line 200, and the switching transistors SWT are coupled to digit lines D1, D2, D3 and D4, respectively. A selecting transistor SE is provided in association with every four EEPROM cells, and the selecting transistor SE is coupled between the control gates of the component storage transistors STR and a control gate line 201. Though not shown in the drawings, every word line is shared between the EEPROM cells in every row, and the word line is coupled to the gate electrodes of the selecting transistors SE as well as the gate electrodes of the switching transistors SWT. The digit lines D1 to D4 are also shared between the EEPROM cells in every column and coupled to one of the selector circuits 41 to 4m incorporated in the column selector unit 4.

Turning back to FIG. 1, every selector circuit has five switching transistors 41a, 41b, 41c, 41d and 41e which are coupled to the digit lines D1 to D4 and the control gate line 201. There is a substantial amount of area between the column selector unit 4 and the sense amplifier unit 5, and a common gate control line 6, a plurality of output lines 71 to 7m of a column address decoder unit 7 and a plurality of common digit lines 8a, 8b, 8c and 8d extend in the area therebetween. The common gate control line 6 is coupled to the switching transistors associated with the gate control lines 201, and the output lines 71 to 7m are coupled to the selector circuits 41 to 4m, respectively. The common digit lines 8a to 8d are respectively coupled to sense amplifier circuits 5a, 5b, 5c and 5d of the sense amplifier unit 5. The first digit line D1 of every EEPROM cell group is coupled to the common digit line 8a, and the common digit line 8b is shared between the second digit lines D2 of the EEPROM cell groups. Similarly, the common digit lines 8c and 8d are respectively coupled to the third digit lines D3 and the fourth digit lines D4.

In operation, the row address decoder unit 3 selects one of the word lines W1 to Wn in accordance with row address bits, and the word line thus selected allows the selecting transistors SE and the switching transistors SWT of the EEPROM cell groups in the associated row. Column address bits causes the column address decoder unit 7 to select one of the output lines 71 to 7m, and the selected output line allows the five switching transistors 41a to 41e of associated one of the selector circuits 41 to 4m. Then, one of the EEPROM cell groups is activated by the gate control line 201, and the voltage levels on the digit lines D1 to D4 depend upon the data bits memorized in the storage transistors STR of the EEPROM cell group. The voltage levels on the digit lines D1 to D4 are propagated through the selector circuit and the common digit lines 8a to 8d to the sense amplifier circuits 5a to 5d, respectively. The sense amplifier circuits 5a to 5d quickly decide the logic levels of the data bits, and the data bits are reported to an external device.

However, a problem is encountered in the prior art non-volatile semiconductor memory device shown in FIG. 1 in that the output lines 71 to 7m are too long to achieve a high speed selection of the selector circuits 41 to 4m. This is because of the fact that the output lines 71 to 7m firstly extend over the area between the column selector unit 4 and the sense amplifier unit 5 in parallel to the word lines W1 to Wn and are branched at appropriate points so as to couple with the selector circuits 41 to 4b. Such a long output line 71 or 7m is causative of a large amount of parasitic capacitance, and a substantial amount of time delay is introduced in the signal propagation on the output line. This results in that the column address decoder unit 7 operates at a low speed with a large amount of power consumption.

If the number of the EEPROM cells is increased, the output lines 71 to 7m are prolonged due to the additional EEPROM cells provided on the right side of the memory cell array 2, and the aforementioned problem becomes serious. The non-volatile semiconductor memory device is incorporated in a microprocessor and provides a storage for a sequence of instruction codes. The memory capacity is varied with the microprocessor model, and, accordingly, the memory cell array 2 is different in size. If the memory cell array is varied in size, the length of the output lines 71 to 7m is changed and has an influence on the time delay of the signal on the output lines 71 to 7m as described above. Such a different time delay requests the designer to check the timing for fetching the instruction code in the design work of a new model and, accordingly, deteriorates the design efficiency.

Another problem inherent in the prior art is encountered in determination of paths where the output lines 71 to 7m are formed. When data bits are rewritten into the EEPROM cells, an extremely high voltage level such as 12.5 volts or 20 volts is applied thereto, and, for this reason, various limitations are set on the design work so as to remove undesirable influences on other components. The various limitations are related to not only the structures of the component elements but also the layout of the nonvolatile semiconductor memory device. Since the memory cell array 2, the row address decoder unit 3 and the column address decoder unit 7 are changed in size depending upon the memory capacity, the area available for the output lines 71 to 7m are varied, and new paths should be determined under the limitations. This results in deterioration of the design efficiency.

Still another problem is the area occupied by the output lines 71 to 7m. The area is provided for the output lines 71 to 7m only, and the large amount of the wiring area deteriorates the integration density.

Turning to FIG. 3 of the drawings, another prior art non-volatile semiconductor memory device is fabricated on a semiconductor chip 31. The component units and elements are similar to those of the prior art non-volatile semiconductor memory device shown in FIG. 1, and, for this reason, corresponding units and elements are designated by the same reference marks and the same reference numerals without any detailed description. A difference between the prior art non-volatile semiconductor memory devices shown in FIGS. 1 and 3 is the location of the column address decoder unit 7. In the non-volatile semiconductor memory device shown in FIG. 1, the column address decoder unit 7 is located on the left side of the sense amplifier unit 5, and, for this reason, the output lines 71 to 7m extend in the lateral direction of the memory cell array 2. However, the column address decoder unit shown in FIG. 3 is arranged in such a manner as to be on the opposite side to the selector unit 4. This arrangement deletes the output lines 71 to 7m extending over the lateral distance of the memory cell array 2. However, the column decoder unit 7 shown in FIG. 3 still needs output lines 9a to 9d extending over the memory cell array 2 in the vertical direction thereof. The output lines 9a to 9d are still so long that large parasitic capacitances are coupled thereto. The output lines 9a to 9d are also increased with the number of the EEPROM cells incorporated in the memory cell array 2, because additional EEPROM cells increase the number of the rows. Thus, the prior art non-volatile semiconductor memory device shown in FIG. 3 is not free from the problems inherent in the prior art non-volatile semiconductor memory device shown in FIG. 1.

Turning to FIG. 4 of the drawings, still another prior art non-volatile semiconductor memory device is fabricated on a semiconductor chip 42. A memory cell array 43 incorporated in the non-volatile semiconductor memory device consists of a plurality of electrically programmable read only memory cells (which are hereinbelow abbreviated as "EPROM cell(s)"), and data bits memorized therein are erased with an ultra-violet radiation. The non-volatile semiconductor memory device shown in FIG. 4 is responsible to the nibble mode of operation. However, the semiconductor memory device shown in FIG. 4 is slightly simpler than that shown in FIG. 1, and no selecting transistor corresponding to the transistor SE is associated with the EPROM cells. Because the EPROM cells concurrently accessed are selected from the EPROM cells in one of the rows, but are not adjacent to one another. A column selector unit 44 is located in the vicinity of the memory cell array 43, and output lines 45a, 45b, 45c and 45d extend in an area between the column selector unit 44 and the sense amplifier unit 5. Since no gate control line and no common digit line is provided in the area between the column selector unit 44 and the sense amplifier unit 5, the area is decreased with respect to that of the non-volatile semiconductor memory device shown in FIG. 1. The column address decoder unit 7 is located on the left side of the sense amplifier circuit 5 and in front of the row address decoder unit 3, and the output lines 45a to 45d are forced to bend twice. The expansion of the memory cell array 43 causes the row address decoder unit 3 and the column address decoder unit 7 to be relocated, and the output lines 45a to 45d are rearranged to reach the area between the column selector unit 44 and the sense amplifier unit 5. Thus, the prior art non-volatile semiconductor memory device shown in FIG. 4 has a difficulty in design efficiency due to the rearrangement of the output lines 45a to 45d.

SUMMARY OF THE INVENTION

It is therefore an important object of the present invention to provide a non-volatile semiconductor memory device which is free from the problems and difficulties inherent in the prior art non-volatile semiconductor memory devices.

To accomplish these objects, the present invention proposes to locate common digit line or lines and a column selector unit between a memory cell array and a combination of a sense amplifier unit and a column address decoder unit.

In accordance with the present invention, there is provided a non-volatile semiconductor memory device fabricated on a semiconductor chip, comprising: a) a memory cell array having a plurality of non-volatile memory cells arranged in rows and columns, the memory cell array occupying a first area of the semiconductor chip; b) a row address decoder unit coupled through word lines to the rows of the non-volatile memory cells and responsive to row address bits for shifting one of the word lines to an active level; c) a column selector unit coupled through digit lines to the columns of the non-volatile memory cells and occupying a second area of the semiconductor chip, the second area being contiguous to the first area; d) a sense amplifier unit selectively coupled through the column selector unit to the digit lines; e) a column address decoder unit responsive to column address bits and coupled through output lines to the column selector unit so as to allow the sense amplifier unit to be selectively coupled to the digit lines, in which a third area of the semiconductor chip contiguous to the second area is provided for wirings, and in which the sense amplifier unit and the column address decoder unit occupy a fourth area of the semiconductor chip contiguous to the third area, wherein the output lines extend over the third area.

BRIEF DESCRIPTION OF THE DRAWINGS

The features and advantages of a non-volatile semiconductor memory device according to the present invention will be more clearly understood from the following description taken in conjunction with the accompanying drawings in which.

DESCRIPTION OF THE PREFERRED EMBODIMENTS

First Embodiment

Figure 5:
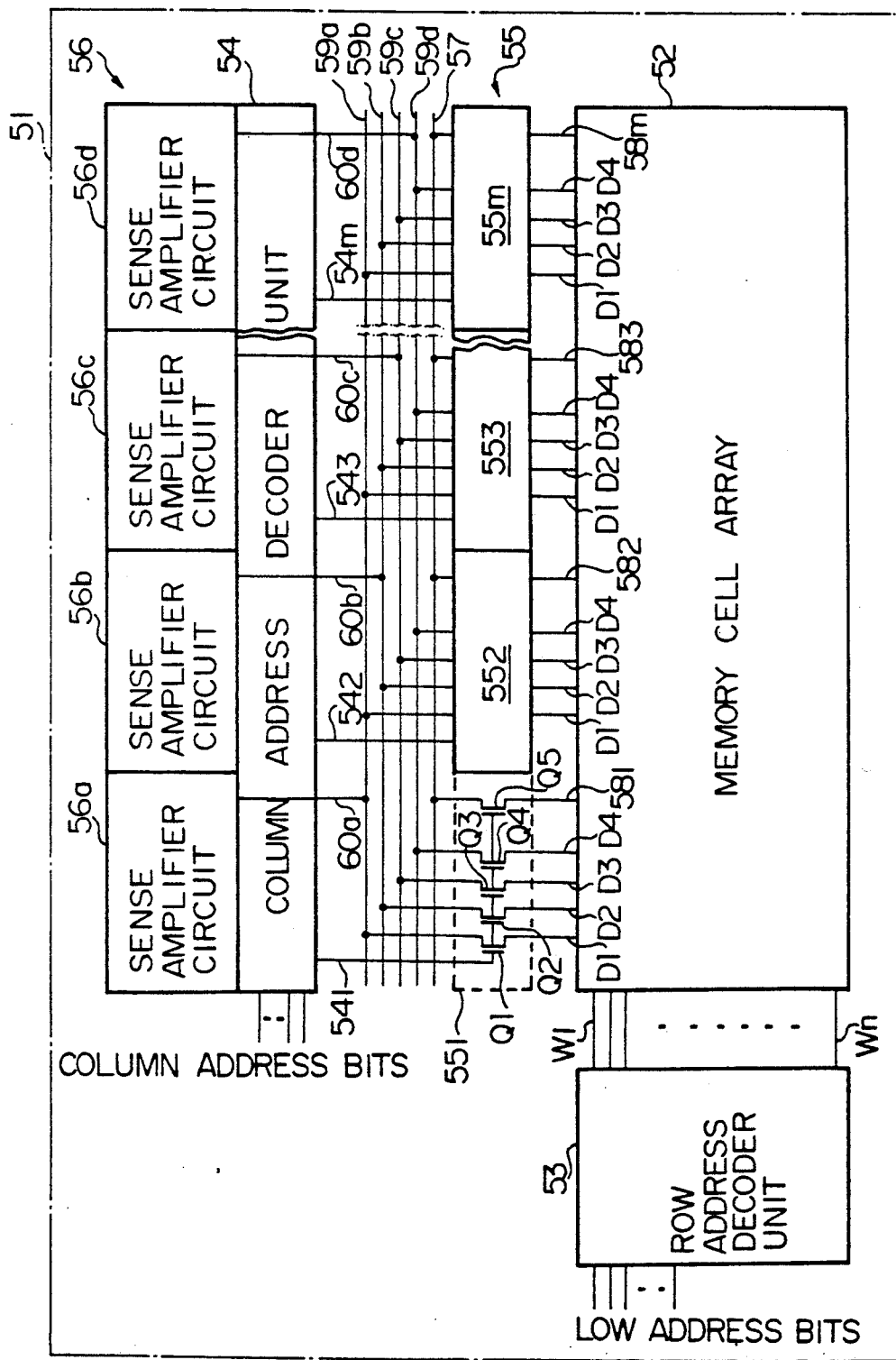
FIG. 5 is a block diagram showing the layout of a nonvolatile semiconductor memory device according to the present invention.

Referring to FIG. 5 of the drawings, a non-volatile semiconductor memory device embodying the present invention is fabricated on a single semiconductor chip 51. The non-volatile semiconductor memory device is incorporated in a microprocessor for providing a memory storage of instruction codes, and FIG. 5 shows only an essential part of the non-volatile semiconductor memory device according to the present invention. Other component units such as a data input-and-output unit, a controlling unit and a bootstrap circuit are further incorporated in the non-volatile semiconductor memory device, but they are omitted from the figure, because the gist of the present invention is not directly related thereto.

The non-volatile semiconductor memory device comprises a memory cell array 52, a row address decoder unit 53 responsive to row address bits and coupled to the memory cell array through word lines W1 to Wn, a column address decoder unit 54 responsive to column address bits and shifting one of the output lines 541, 542, 543 , . . . and 54m to an active level, a column selector unit 55 having a plurality of column selector circuits 551, 552, 553 , . . . and 55m, and a sense amplifier unit 56 having sense amplifier circuits 56a, 56b, 56c and 56d. The memory cell array 52 occupies a first area of the semiconductor chip 51, and the column selector unit 55 occupies a second area of the semiconductor chip 51.

Figure 1:
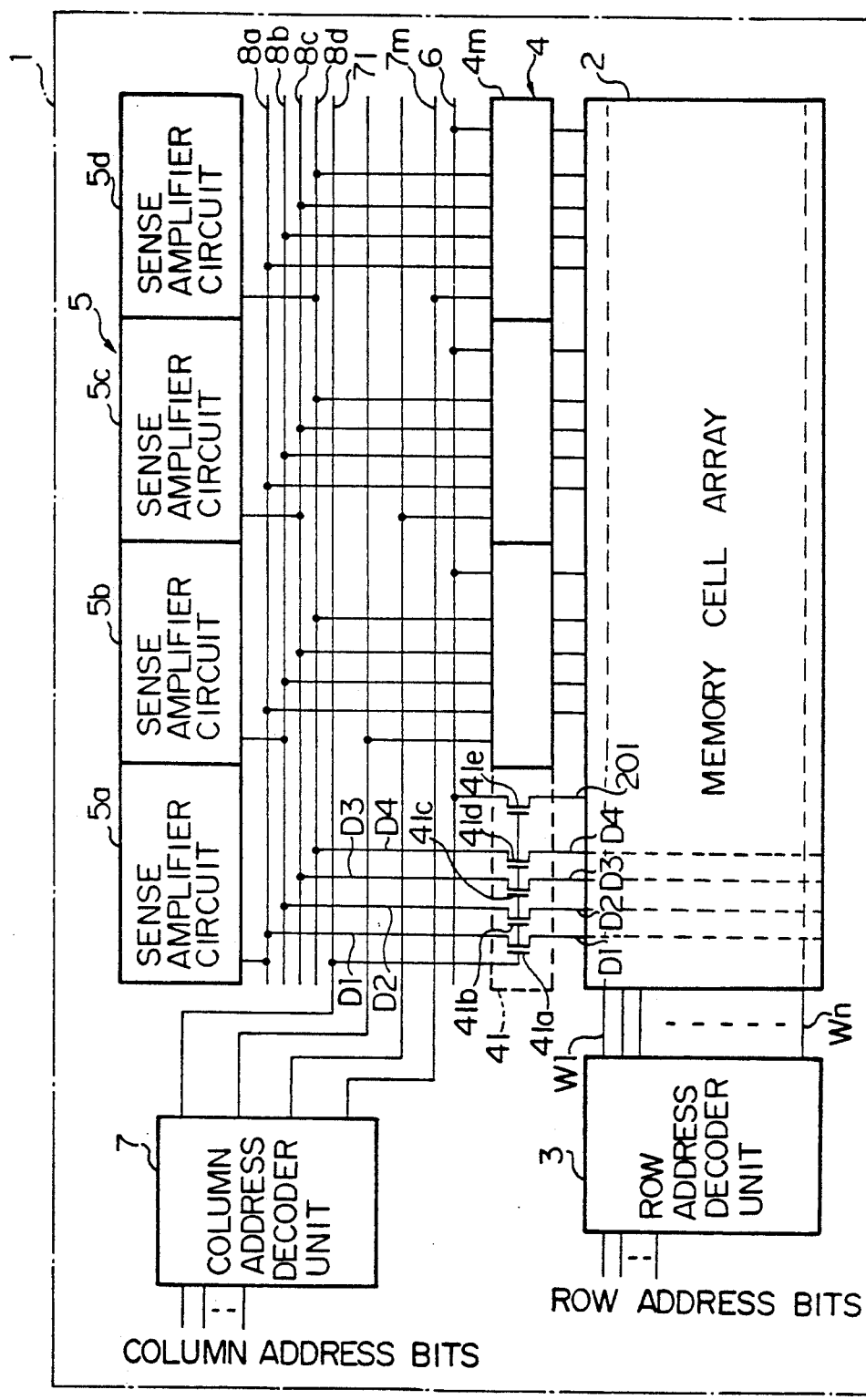
FIG. 1 is a block diagram showing the layout of a prior art non-volatile semiconductor memory device.
Figure 2:
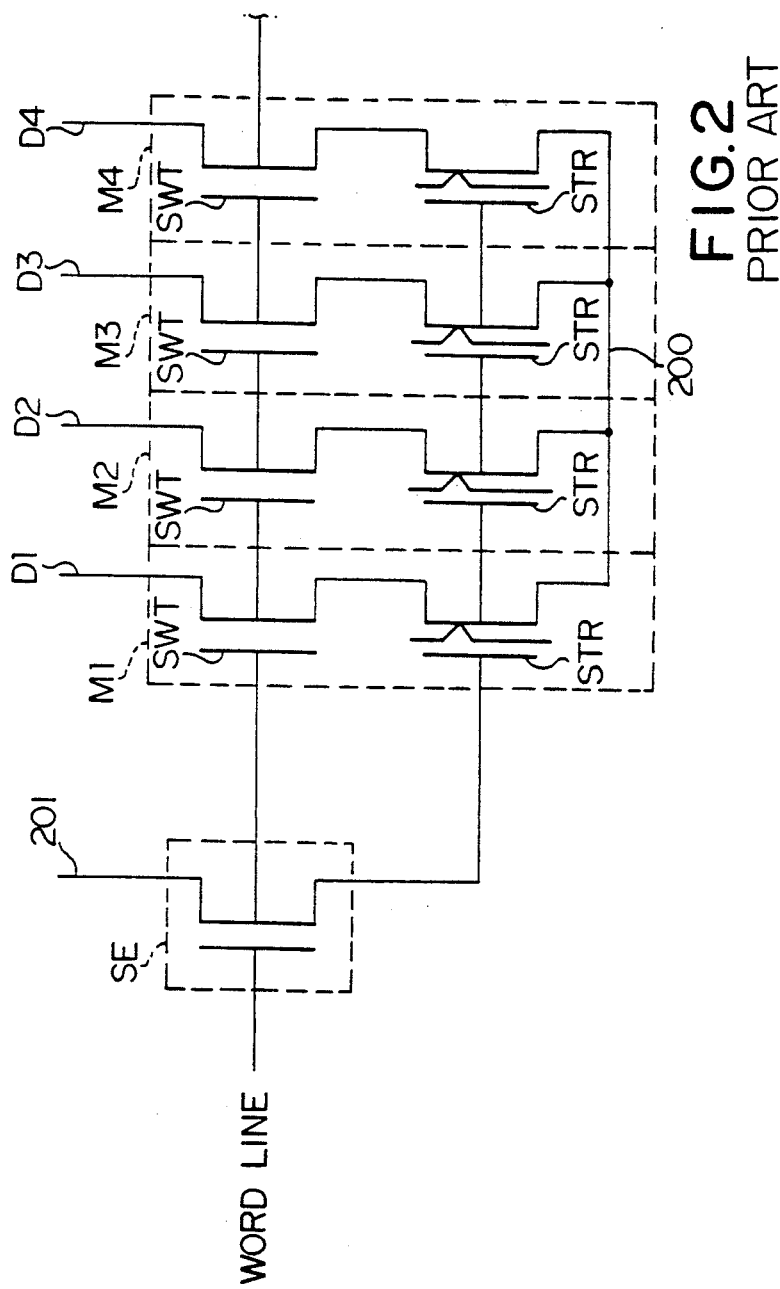
FIG. 2 is a circuit diagram showing the arrangement of an EEPROM cell group incorporated in the non-volatile semiconductor memory device shown in FIG. 1.
Figure 3:
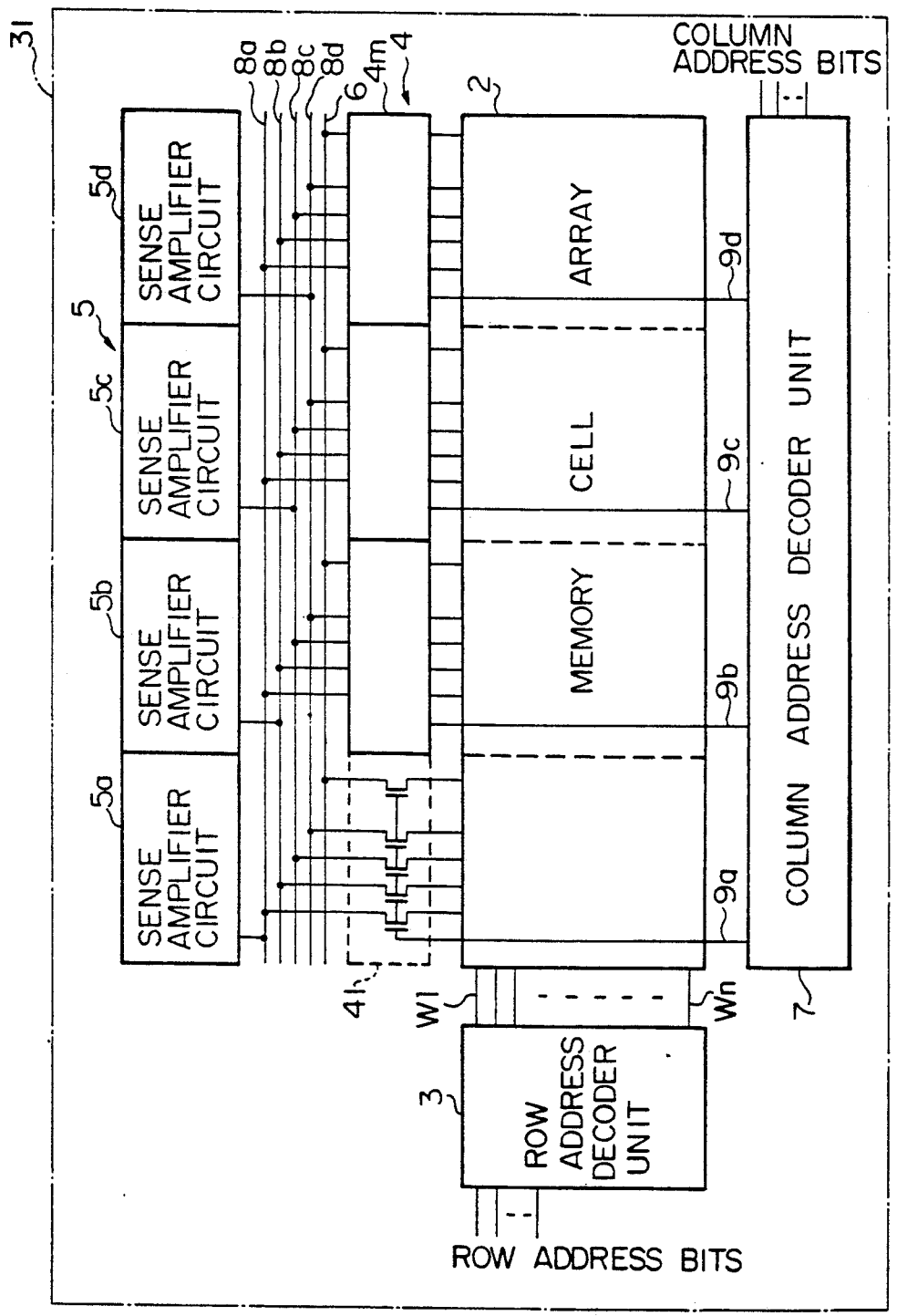
FIG. 3 is a block diagram showing the layout of another prior art non-volatile semiconductor memory device.

The memory cell array 52 contains a plurality of EEPROM cells, and every four EEPROM cells are grouped in an EEPROM cell group as similar to that shown in FIG. 2. The EEPROM cell groups are arranged in rows and columns, and four digit lines D1, D2, D3 and D4 are provided in association with the EEPROM cell groups in every column. Each of the word lines W1 to Wn is coupled to gate electrodes of the selecting transistors SE and the gate electrodes of the switching transistors SWT incorporated in the EEPROM cell groups in each row, and the row address decoder unit 3 shifts one of the word lines W1 to Wn to an active level so that all of the selecting transistors SE and all of the switching transistors SWT of the EEPROM cell groups in the same row concurrently turn on, Each of the column selector circuits 551 to 55m has five switching transistors Q1, Q2, Q3, Q4 and Q5, and the five switching transistors Q1 to Q5 are gated by one of the output lines 541 to 54m of the column address decoder unit 54. With one of the output lines 541 to 54m to be shifted to an active level in accordance with the column address bits, the switching transistors Q1 to Q4 concurrently turn on and provide conduction paths in the digit lines D1, D2, D3 and D4, respectively. The output line to be shifted to the active level also allows the switching transistor Q5 to turn on, and a common gate control line 57 is coupled through the switching transistor Q5 to a gate control line 581, 582, 583 , . . . or 58m. The gate control line thus coupled to the common gate control line 57 activates the four EEPROM cells, and the four EEPROM cells are coupled through the switching transistors Q1 to Q4 to common digit lines 59a, 59b, 59c and 59d. The common digit lines 59a to 59d are coupled through interconnections 60a, 60b, 60c and 60d to the sense amplifier circuits 56a to 56d, respectively. Thus, only one EEPROM cell group is coupled to the sense amplifier unit 56, and current is supplied to the four EEPROM cells. Since the threshold level is either high or low depending upon a data bit memorized in the EEPROM cell, the four EEPROM cells allow the current to be discharged or not depending upon the data bits memorized therein. Then, the digit lines D1 to D4 and, accordingly, the common digit lines 59a to 59d are changed to either high or low voltage level. The sense amplifier circuits 56a to 56d rapidly decide the logic levels of the data bits, and the data bits are supplied to the outside thereof as a nibble data. The common digit lines 59a to 59d as a whole constitute digit line means and occupy a third area of the semiconductor chip 51 together with the common gate control line 57. The sense amplifier unit 56 and the column address decoder unit 54 occupy a fourth area of the semiconductor chip 51.

The row address decoder unit 53 is located on the left side of the memory cell array 52, and the column selector unit 55 is provided between the common gate control line 57 and the memory cell array 52 as similar to the prior art non-volatile semiconductor memory device. However, the column address decoder unit 54 is located between the common digit lines 59a to 59d and the sense amplifier unit 56. Thus, the second area is contiguous to the first and third areas on both sides thereof, and the fourth area is contiguous to the third area. The fourth area is divided into first and second sub-areas, and the column address decoder unit 54 and the sense amplifier unit 56 are formed in the first and second sub-areas, respectively.

By virtue of this arrangement, the non-volatile semiconductor memory device according to the present invention is free from the problems and the difficulties inherent in the prior art non-volatile semiconductor memory devices.

In detail, the output lines 541 to 54m extend over only five signal lines, i.e. the four common digit lines 59a to 59d and the common gate control line 57, and, for this reason, the length of the output lines 541 to 54m is much shorter than those of the prior art non-volatile semiconductor memory devices. The output lines 541 to 54m thus decreased in length promptly propagate the signals fed from the column address decoder unit 54, and, accordingly, allow the column selector unit 55 to operate at an improved speed. Moreover, if the memory cell array 52 is increased in size or memory capacity, additional EEPROM cell groups have no influence on the output lines 541 to 54m, and, for this reason, any additional time delay is introduced in the signal propagation along the output lines 541 to 54m. The data bits read out from an EEPROM cell group is propagated by the signal path slightly prolonged due to the interconnections 60a to 60d. However, no substantial time delay is introduced into the data bit propagation, because the column address decoder unit 54 is relatively small in width.

The non-volatile semiconductor memory device shown in FIG. 5 is advantageous in integration density. The output lines 541 to 54m across the lines 59a to 59d and 57, and a multiple level wiring structure allows the output lines 541 to 54m to extend over the lines 59a to 59d and 57 without any short-circuiting. This means that no real estate is provided for the output lines 541 to 54m only, and, for this reason, the semiconductor chip 51 is decreased in size with respect to the semiconductor chip 1. The decrement of the real estate RE is given as follows:

$$RE1 = [NOL \times (W1 + SP1)] \times (ND \times W2) \qquad \text{(Eq. 1)}$$

where NOL is the number of the output lines 71 to 7m, W1 is the width of each output line, SP1 is the gap between the adjacent two output lines, ND is the number of the digit lines D1 to D4, and W2 is the width of each EEPROM cell. For example, if NOL is 16, W1 is 2 microns, SP1 is 2 microns, ND is 12 and W2 is 8 microns, the amount of the real estate to be decreased is $16 \times 4 \times 12 \times 8 = 6144$ square micron.

The semiconductor chip 51 is smaller than the semiconductor chip 31, and the decrement of the real estate is given as follows:

$$RE2 = NOL \times (W3 + SP3)] \times NW \times L \qquad \text{(Eq. 2)}$$

where NOL is the number of the output lines 9a to 9d, W3 is the width of each output line, SP3 is the gap between the adjacent output lines, NW is the number of the word lines W1 to Wn, and L is the length of each EEPROM cell. NOL, W3, SP3, NW and L are assumed to be 16, 2 microns, 2 microns, 128 and 16 microns, then the decrement of the real estate is $16 \times 4 \times 128 \times 16 = 131072$ square micron.

Moreover, when the memory capacity is increased, the paths of the output lines 71 to 7m need rearrangement as described hereinbefore; however, the layout of the output lines 541 to 54m is applicable to a new model without any rearrangement. This enhances the design efficiency.

Second Embodiment

Figure 6:
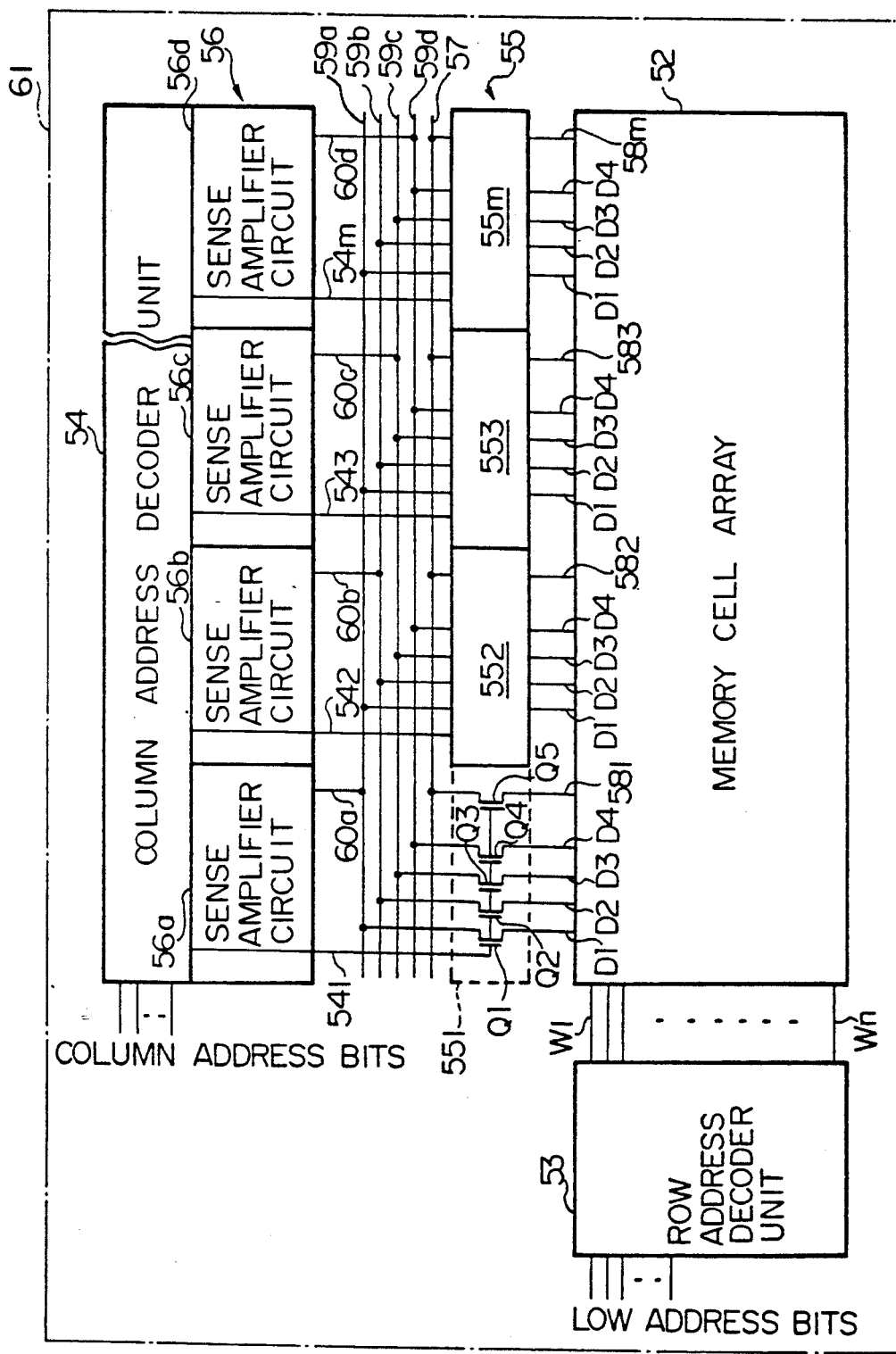
FIG. 6 is a block diagram showing the layout of another non-volatile semiconductor memory device according to the present invention.

Turning to FIG. 6 of the drawings, another non-volatile semiconductor memory device is fabricated on a semiconductor chip 61. The non-volatile semiconductor memory device shown in FIG. 6 is similar to that shown in FIG. 5 except for the location of the column address decoder unit. For this reason, corresponding units and elements are designated by the same reference numerals and marks used in FIG. 5. The fourth area is divided into first and second sub-areas, and the first sub-area is contiguous to the third area. In this instance, the sense amplifier unit 56 is formed in the first sub-area, and the column address decoder unit 54 occupies the second sub-area. Thus, the sense amplifier unit 56 is closer to the column selector unit 55, the interconnections 60a to 60d are shorter than those of the first embodiment. The output lines 541 to 54m extend across the first sub-area and third area, but the arrangement of the output lines 541 to 54m are not affected by any expansion of the memory cell array. This enhances the design efficiency.

Third Embodiment

Figure 7:
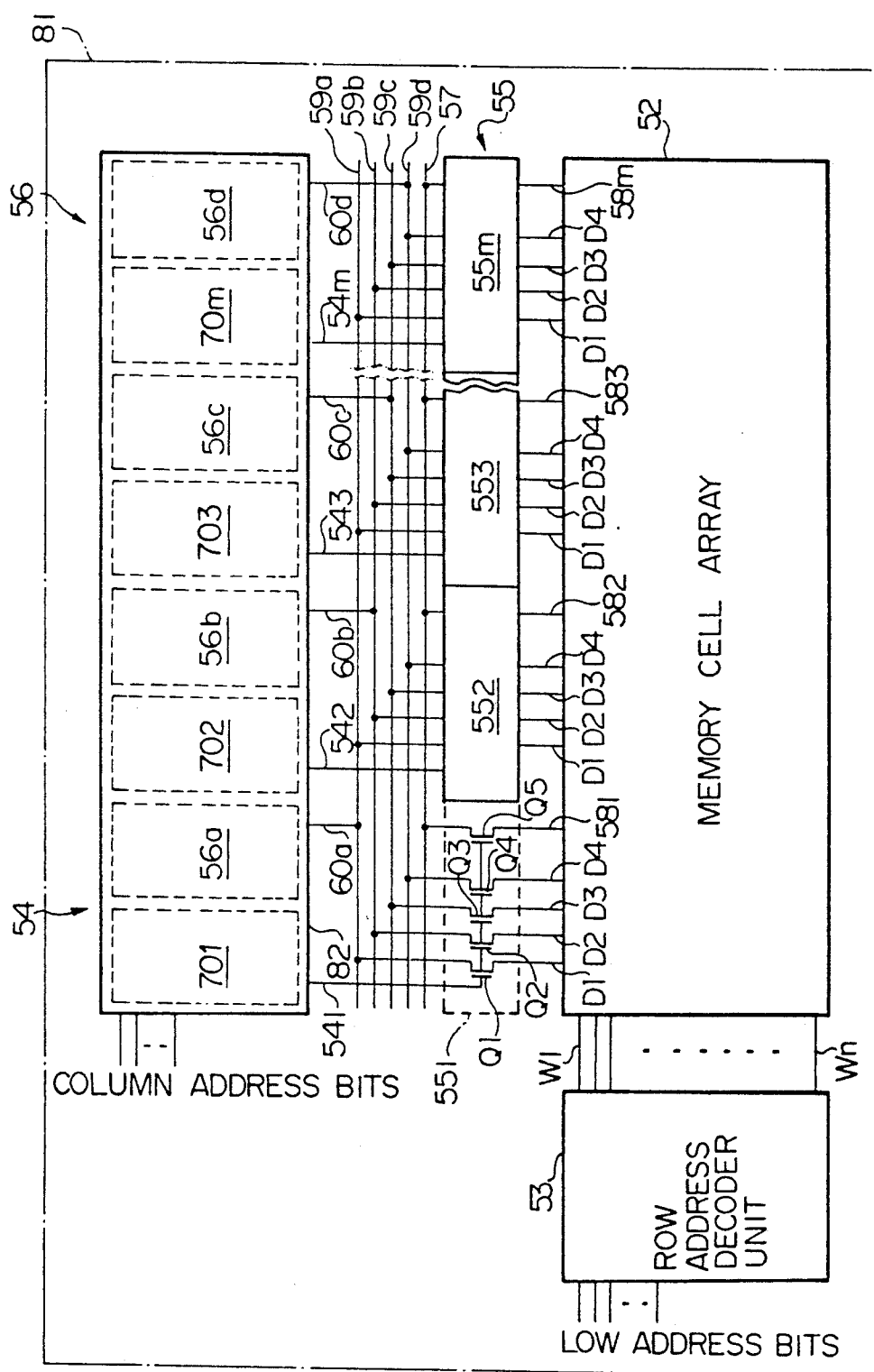
FIG. 7 is a block diagram showing the layout of still another non-volatile semiconductor memory device according to the present invention.

Turning to FIG. 7 of the drawings, still another non-volatile semiconductor memory device is fabricated on a semiconductor chip, and the component units and elements are similar to those of the first embodiments. The corresponding units and elements are designated by the same reference numerals and marks as similar to the second embodiment. In this instance, the column address decoder unit 54 is divided into a plurality of column address decoder sections 701, 702, 703 , . . . and 70m, and the sense amplifier circuits 56a to 56d are inserted between the column address decoder sections 701, 702, 703 , . . and 70m. All of the column address decoder section 701 to 70m and all of the sense amplifier circuits 56a to 56d are faced to the boundary 82 between the third and fourth areas, and not only the output lines 541 to 54m but also the interconnections 60a to 60d respectively take the shortest paths. The arrangement of the output lines 541 to 54m and the interconnections 60a to 60d are free from any expansion of the memory cell array 52 and enhances the design efficiency.

Fourth Embodiment

Figure 8:
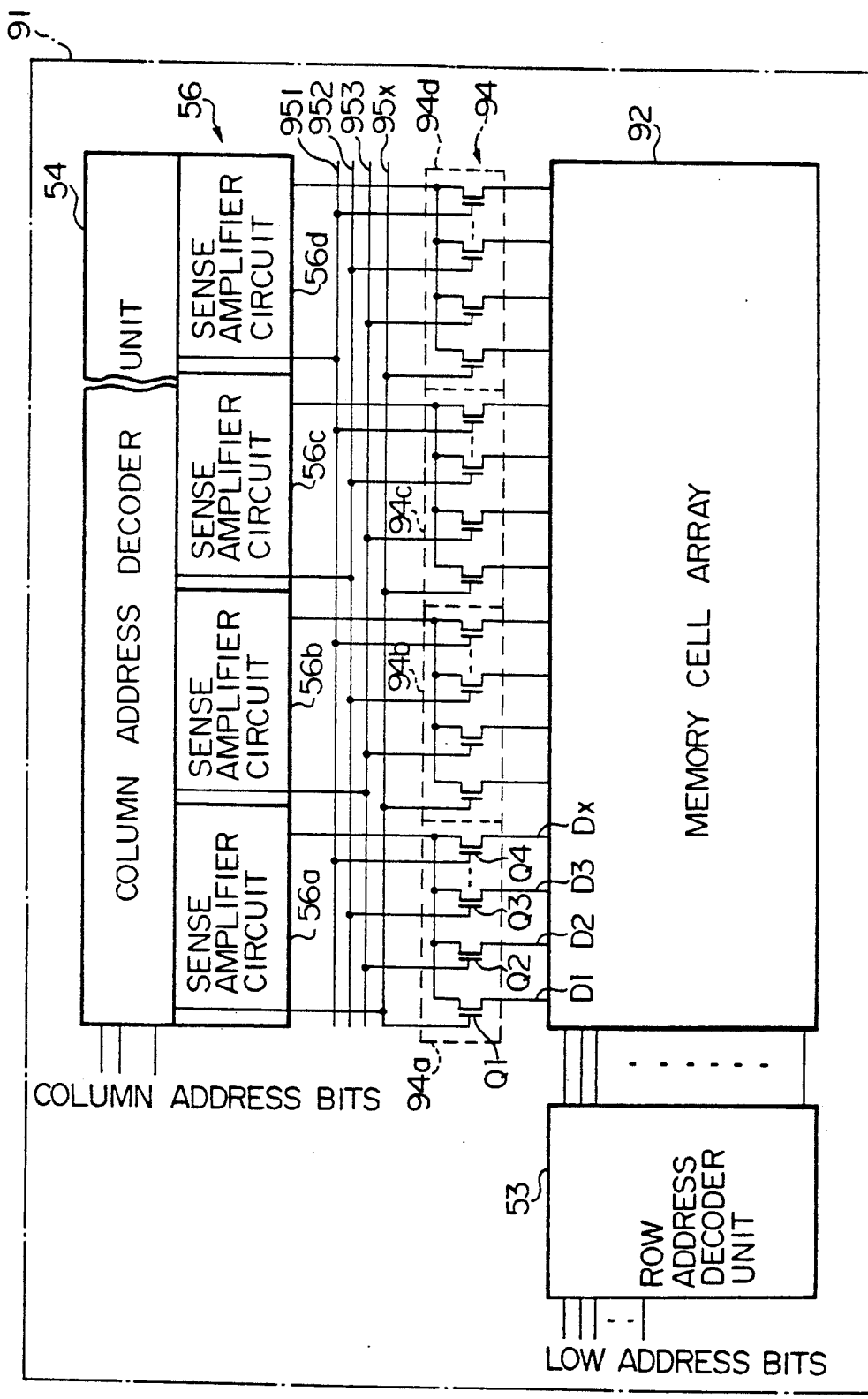
FIG. 8 is a block diagram showing the layout of still another non-volatile semiconductor device according to the present invention.
Figure 9:
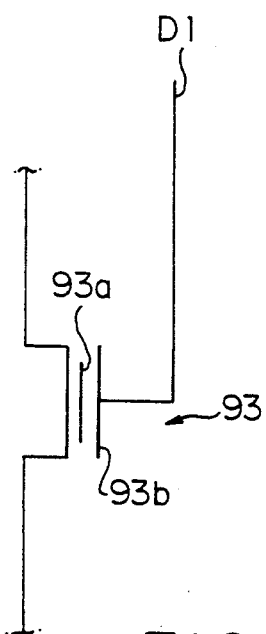
FIG. 9 is a view showing an EPROM cell incorporated in the non-volatile semiconductor device shown in FIG. 8.

Turning to FIG. 8, a non-volatile semiconductor memory device fabricated on a semiconductor chip 91 is illustrated. The non-volatile semiconductor memory device is of the electrically programmable read only memory device, and EPROM cells arranged in matrix form a memory cell array 92. Each of the EPROM cells is implemented by a floating gate avalanche injection type metal oxide semiconductor transistor 93 shown in FIG. 9, and hot electrons injected into the floating gate 93a changes the threshold voltage thereof. If no hot electrons are injected into the floating gate 93a, a conductive channel takes place upon application of a control signal to the control gate 93b. However, hot electrons do not allow any conductive channel to take place. Thus, the EPROM cell memorizes a data bit as the difference in threshold voltage level, and the data bit is erasable in an ultra-violet radiation. In this instance, the non-volatile semiconductor memory device is responsive to the nibble mode of operation. However, every four EPROM cells concurrently accessible are not gathered, and, for this reason, no selecting transistor SE is associated with the EPROM cells.

A column selector unit 94 is slightly different from the column selector unit 55. Namely, the column selector unit 94 is constituted by four column selector circuits 94a, 94b, 94c and 94d, and each of the column selector circuits 94a to 94d is implemented by a plurality of switching transistors Q1, Q2, Q3 , . . . and Qx. The switching transistors Q1 to Qx are coupled between one of the sense amplifier circuits 56a to 56d and the digit lines D1, D2, D3 , . . . and Dx, and the switching transistors Q1 to Qx are gated by output lines 951, 952, 953 , . . . and 95x, respectively. The other column selector circuits 94b, 94c and 94d are arranged as to be similar to the column selector circuit 94a, and each of the output lines 951, 952, 953 , . . . and 95x allows four switching transistors respectively selected from the four column selector circuits 94a to 94d to concurrently turn on. Then, four data bits are transferred to the four sense amplifier circuits 56a to 56d through the four switching transistors in the on-state.

Figure 4:
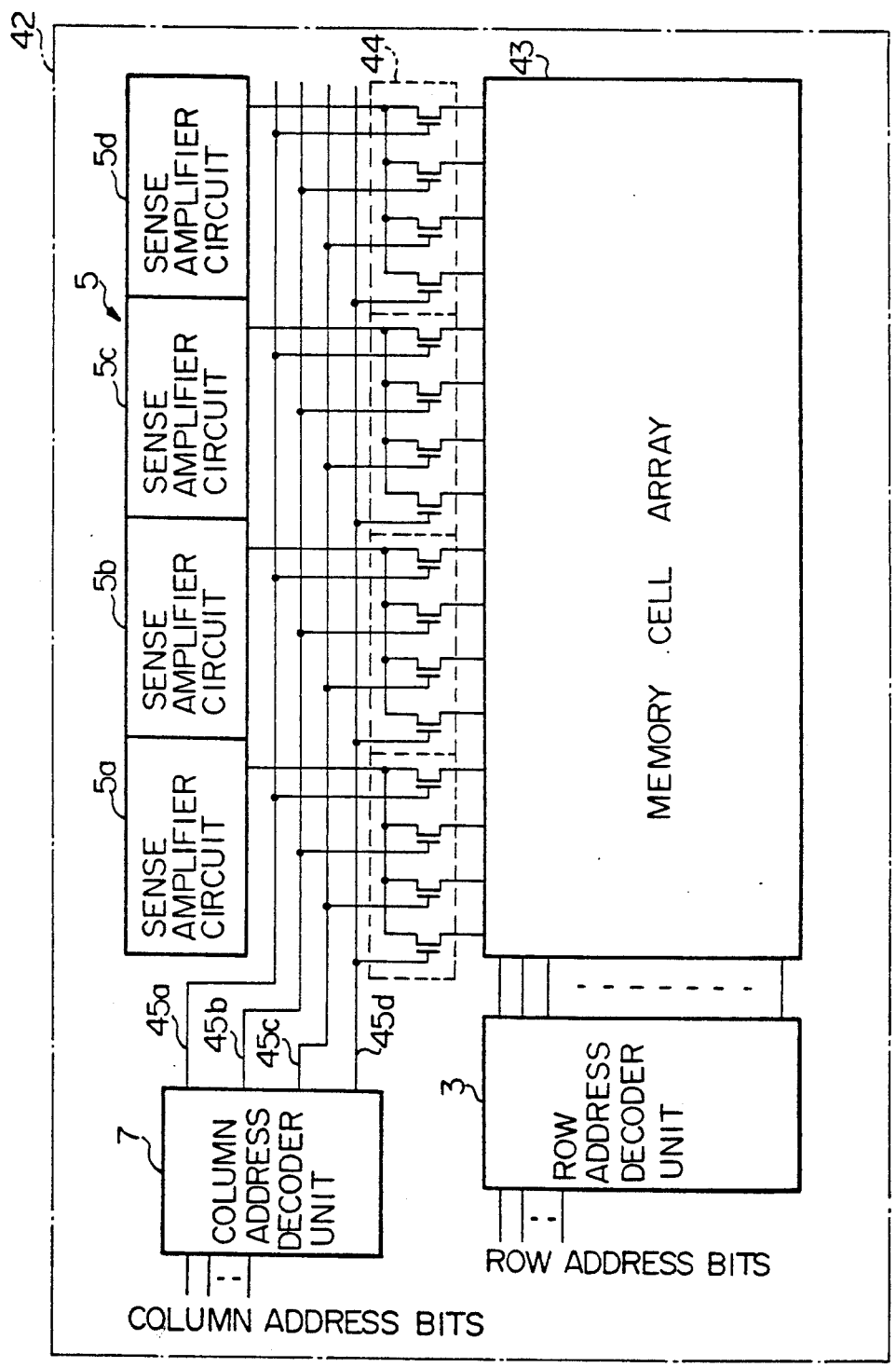
FIG. 4 is a block diagram showing the layout of still another prior art non-volatile semiconductor memory device.

The output lines 951 to 95x interconnect the column address decoder unit 54 and the column selector unit 94. The output lines 951 to 95x extend over the sense amplifier unit 56 and, then, run along the boundary between the third and fourth areas. The third area may not be drastically decreased in comparison with the prior art non-volatile semiconductor memory device shown in FIG. 4. However, the arrangement of the output lines 951 to 95x is free from an extension of the memory cell array 92 and, accordingly, improves the design efficiency of the non-volatile semiconductor memory device.

As will be understood from the foregoing description, the non-volatile semiconductor memory device according to the present invention is advantageous over the prior art non-volatile semiconductor memory devices in the design efficiency, because no rearrangement of the output lines is necessary for an expansion of the memory cell array.

Although particular embodiments of the present invention have been shown and described, it will be obvious to those skilled in the art that various changes and modifications may be made without departing from the spirit and scope of the present invention. The non-volatile semiconductor memory devices described hereinbefore are used for nibble data; however, another implementation may memorize bytes of data bits or data words. In other words, the present invention is advantageous regardless of data format.

The non-volatile semiconductor memory device according to the present invention may form a macro-cell or a circuit block for a predetermined function, and the macro-cell or the non-volatile memory block forms a semicustom-made integrated circuit together with other macro-cells. In such an implementation, the reduction in the third area results in a small semiconductor chip. Moreover, the continuous first to fourth areas are easily shaped in a rectangular configuration, and such a rectangular configuration allows a semicustom-made integrated circuit to have a large number of macro-cells. The present invention is easily adaptable for design automation tools such as, for example, a memory macro module generator or a silicon compiler because of its simple unit arrangement and simple wire connection between those units.

What is claimed is:

1. A non-volatile semiconductor memory device fabricated on a semiconductor chip, comprising:
   a) a memory cell array having a plurality of non-volatile memory cells arranged in rows and columns, said memory cell array occupying a first area of said semiconductor chip;
   b) a row address decoder unit coupled through word lines to the rows of said non-volatile memory cells and responsive to row address bits for shifting one of said word lines to an active level;
   c) a column selector unit coupled through digit lines to the columns of said non-volatile memory cells and occupying a second area of said semiconductor chip, said second area being contiguous to said first area;
   d) a sense amplifier unit selectively coupled through said column selector unit to said digit lines;
   e) column address decoder unit responsive to column address bits and coupled through output lines to said column selector unit so as to allow said sense amplifier unit to be selectively coupled to said digit lines by means of data paths coupled therebetween, in which a third area of said semiconductor chip contiguous to said second area is provided for wirings associated with said column selector unit, and in which said sense amplifier unit and said column address decoder unit occupy a fourth area of said semiconductor chip contiguous to said third area, wherein said output lines extend over said third area.

2. A non-volatile semiconductor memory device fabricated on a semiconductor chip, comprising:
   a) a memory cell array having a plurality of non-volatile memory cells arranged in rows and columns, said memory cell array occupying a first area of said semiconductor chip;
   b) a row address decoder unit coupled through word lines to the rows of said non-volatile memory cells and responsive to row address bits for shifting one of said word lines to an active level;
   c) a column selector unit coupled through digit lines to the columns of said non-volatile memory cells and occupying a second area of said semiconductor chip, said second area being contiguous to said first area;
   d) a sense amplifier unit coupled through common digit line means to said column selector unit; and
   e) a column address decoder unit responsive to column address bits and coupled through output lines to said column selector unit so that said digit lines are selectively coupled to said common digit line means upon selection of said output lines, in which said common digit line means occupy a third area of said semiconductor chip contiguous with said second area, and in which said sense amplifier unit and said column address decoder unit occupy a fourth area of said semiconductor chip contiguous to said third area.

3. A non-volatile semiconductor memory device as set forth in claim 2, in which said output lines extend across said third area.

4. An non-volatile semiconductor memory device as set forth in claim 3, in which said column address decoder unit is arranged to be closer to said common digit line means than said sense amplifier unit, and in which said sense amplifier unit is coupled to said common digit line means through interconnections coupled therebetween.

5. An non-volatile semiconductor memory device as set forth in claim 3, in which said sense amplifier unit is arranged to be closer to said common digit line means than said column address decoder unit, and in which said sense amplifier unit is coupled to said common digit line means through interconnections coupled therebetween.

6. A non-volatile semiconductor memory device as set forth in claim 3, in which said column address decoder unit is divided into a plurality of column address decoder sections, and in which said sense amplifier unit has a plurality of sense amplifier circuits, wherein said column address decoder sections and said sense amplifier circuits are arranged along the boundary between said third and fourth areas.

7. A non-volatile semiconductor memory device as set forth in claim 2, in which each of said non-volatile memory cells has an electrically erasable and programmable read only memory element.

8. A non-volatile semiconductor memory device fabricated on a semiconductor chip, comprising:
   a) a memory cell array having a plurality of non-volatile memory cells arranged in rows and columns, said memory cell array occupying a first area of said semiconductor chip;

b) a row address decoder unit coupled through word lines to the rows of said non-volatile memory cells and responsive to row address bits for shifting one of said word lines to an active level;

c) a column selector unit coupled through digit lines to the columns of said non-volatile memory cells and occupying a second area of said semiconductor chip, said second area being contiguous to said first area;

d) a sense amplifier unit coupled to said column selector unit; and e) column address decoder unit responsive to column address bits and coupled through output lines to said column selector unit so as to allow said sense amplifier unit to selectively be coupled with said digit lines, in which said output lines extend in a third area of said semiconductor chip contiguous to said second area, and in which said sense amplifier unit and said column address decoder unit occupy a fourth area of said semiconductor chip contiguous to said third area.

9. A non-volatile semiconductor memory device as set forth in claim 8, in which each of said non-volatile memory cells is implemented by an electrically programmable memory element.

* * * * *